United States Patent
Liao et al.

(10) Patent No.: US 9,543,038 B2
(45) Date of Patent: Jan. 10, 2017

(54) SHIFT REGISTER AND CONTROL METHOD THEREOF

(71) Applicant: AU Optronics Corp., Hsin-Chu (TW)

(72) Inventors: Wei-Chien Liao, Hsin-Chu (TW); Ming-Hung Chuang, Hsin-Chu (TW); Cheng-Chiu Pai, Hsin-Chu (TW); Shu-Wen Tzeng, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 140 days.

(21) Appl. No.: 14/595,228

(22) Filed: Jan. 13, 2015

(65) Prior Publication Data

US 2015/0206597 A1    Jul. 23, 2015

(30) Foreign Application Priority Data

Jan. 20, 2014   (TW) .............................. 103102024 A (51) Int. Cl.
*G11C 19/00*    (2006.01)
*G11C 19/28*    (2006.01)

(52) U.S. Cl.
CPC ....... *G11C 19/28* (2013.01); *G09G 2310/0286* (2013.01)

(58) Field of Classification Search
None
See application file for complete search history.

(56) References Cited

U.S. PATENT DOCUMENTS

| | | | | |
|---|---|---|---|---|
| 7,978,809 B2* | 7/2011 | Lai | .......... | G11C 19/28 377/64 |
| 8,102,962 B2* | 1/2012 | Liu | .......... | G11C 19/28 377/64 |
| 2007/0274432 A1* | 11/2007 | Yu | .......... | G11C 19/28 377/64 |
| 2014/0355731 A1* | 12/2014 | Chien | .......... | G11C 19/28 377/64 |
| 2015/0179277 A1* | 6/2015 | Pai | .......... | G09G 3/20 377/68 |
| 2016/0104449 A1* | 4/2016 | Huang | .......... | G09G 3/3696 345/212 |

* cited by examiner

*Primary Examiner* — Tuan T Lam
(74) *Attorney, Agent, or Firm* — Locke Lord LLP; Tim Tingkang Xia, Esq.

(57) ABSTRACT

A shift register has a first switch, a pull-up circuit, and a pull-down circuit. The first switch receives a first clock signal. The pull-up circuit is configured to turn on the first switch to pull up a voltage level of an output terminal of the shift register. The pull-up circuit has a second switch and a first control circuit. The first control circuit is coupled to a first system power terminal to avoid an excessive voltage difference between two nodes of the first control circuit. The pull-down circuit is configured to pull down the voltage level of the output terminal of the shift register when the first switch is turned off, and further configured to keep a voltage level of a control node of a switch coupled between the output terminal and a second system power terminal at a low voltage.

14 Claims, 7 Drawing Sheets

SHIFT REGISTER AND CONTROL METHOD THEREOF

BACKGROUND OF THE INVENTION

1. Field of the Invention

The present invention is related to a shift register and a method for controlling the same, and more particularly to a low power consumption shift register and a method for controlling the same.

2. Description of the Prior Art

In general, a display panel has a plurality of pixels, a gate driver and a source driver. The source driver is configured to write data signals into turned-on pixels. The gate driver has a plurality of shift register stages which are employed to generate plural gate signals for controlling operations of turning on/off the pixels. However, the shift register according to the prior art uses both P-channel metal-oxide-semiconductor field-effect transistors (PMOSFETs) and N-channel metal-oxide-semiconductor field-effect transistors (NMOSFETs), such that the number of transistors of the shift register according to the prior art is excessive, and that that it is difficult to achieve a narrow bezel design of the display panel.

SUMMARY OF THE INVENTION

An embodiment of the present invention provides a shift register. The shift register comprises a first input end, a second input end, a first switch, a pull-up circuit and a pull-down circuit. The first switch has a first end, a second end and a control end. The first end receives a first clock signal, the second end is coupled to an output end of the shift register, and the control end is coupled to a first node. The pull-up circuit comprises a second switch and a first control circuit. The second switch has a first end, a second end and a control end. The first end of the second switch is coupled to a first system power terminal, and the control end of the second switch is coupled to the first input end. The control circuit is configured to control electrical connection between the second end of the second switch and the first node according to a voltage level of the first system power terminal. The pull-down circuit comprises a third switch, a second control circuit, a third control circuit, a fourth switch, a fifth switch, a sixth switch and a seventh switch. A first end of the third switch is coupled to the first node, a second end of the third switch is coupled to the output end, and a control end of the third switch is coupled to a second node. The second control circuit is configured to control electrical connection between the first system power terminal and a third node according to the first clock signal and configured to control electrical connection between the first system power terminal and a fourth node according to a second clock signal. The third control circuit is configured to control electrical connection between a second system power terminal and the second node and electrical connection between the second system power terminal and the third node according to a voltage level of the first input end. A first end of the fourth switch is coupled to the fourth node, a second end of the fourth switch is coupled to the second node, and a control end of the fourth switch is coupled to the third node. A first end of the fifth switch is coupled to the fourth node, a second end of the fifth switch is coupled to the second system power terminal, and a control end of the fifth switch is coupled to the output end. A first end of the sixth switch is coupled to the output end, a second end of the sixth switch is coupled to the second system power terminal, and a control end of the sixth switch is coupled to the second node. A first end of the seventh switch is coupled to the output end, a second end of the seventh switch is coupled to the second system power terminal, and a control end of the seventh switch is coupled to the second input end.

An embodiment of the present invention provides a method for controlling operations of the shift register. The method comprises steps of: controlling the second clock signal to be at a low voltage level when the first clock signal is at a high voltage level; and controlling the first clock signal to be at the low voltage level when the second clock signal is at the high voltage level.

According to the embodiments of the present invention, waste of power of the shift register may be avoided, such that energy consumption is reduced. Moreover, the switches in each embodiments of the present invention may be transistors of the same type (e.g. NMOSFET). Accordingly, the number of photo-masks for manufacturing the shift register is reduced, and the manufacturing procedure of the shift register is simplified. Since the shift register has fewer transistors due to a compact design, the cost of the shift register could be increased, and it is suitable to achieve the narrow bezel design of the display panel.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
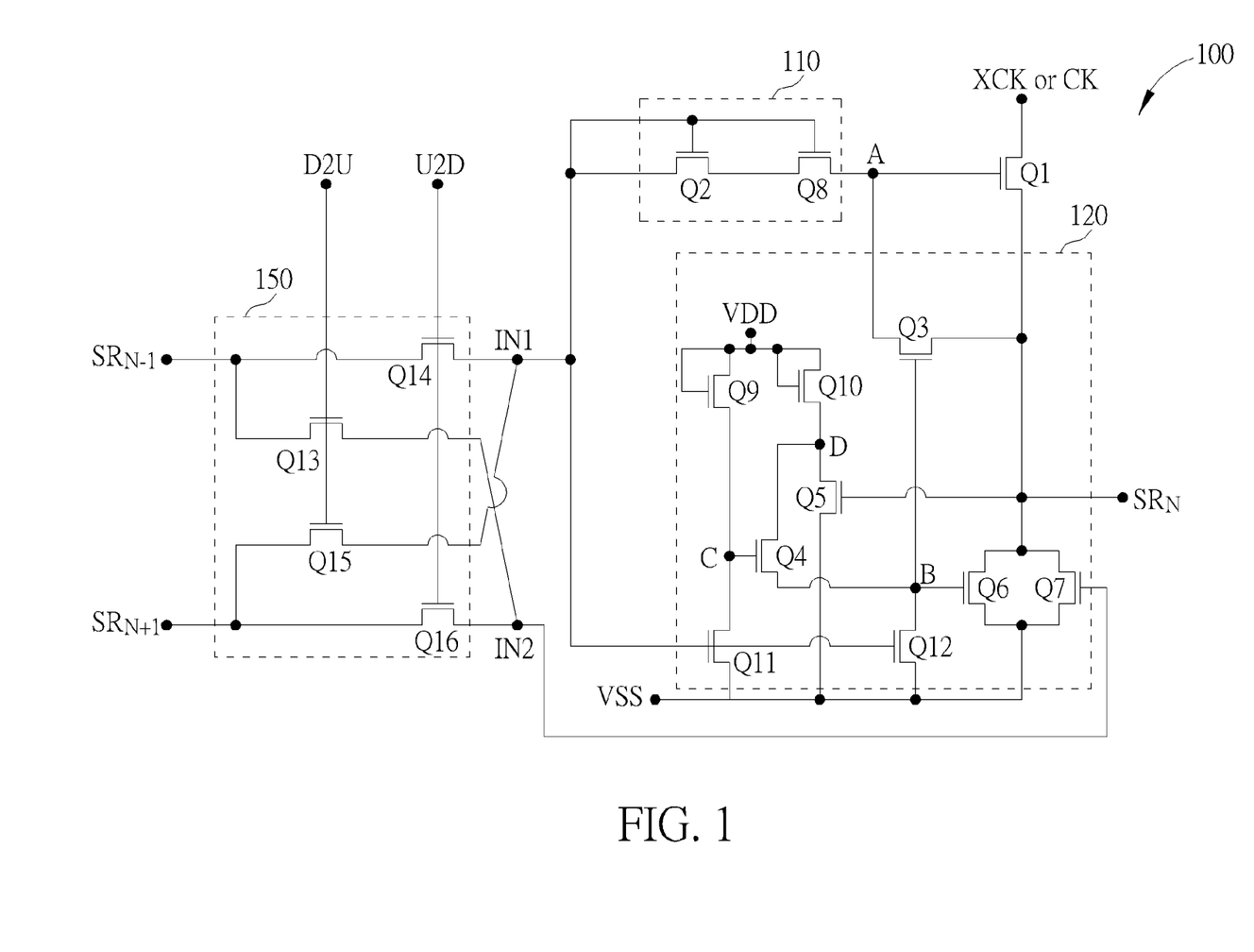
FIG. 1 is a circuit diagram of a shift register according to an embodiment of the present invention.
Figure 2:
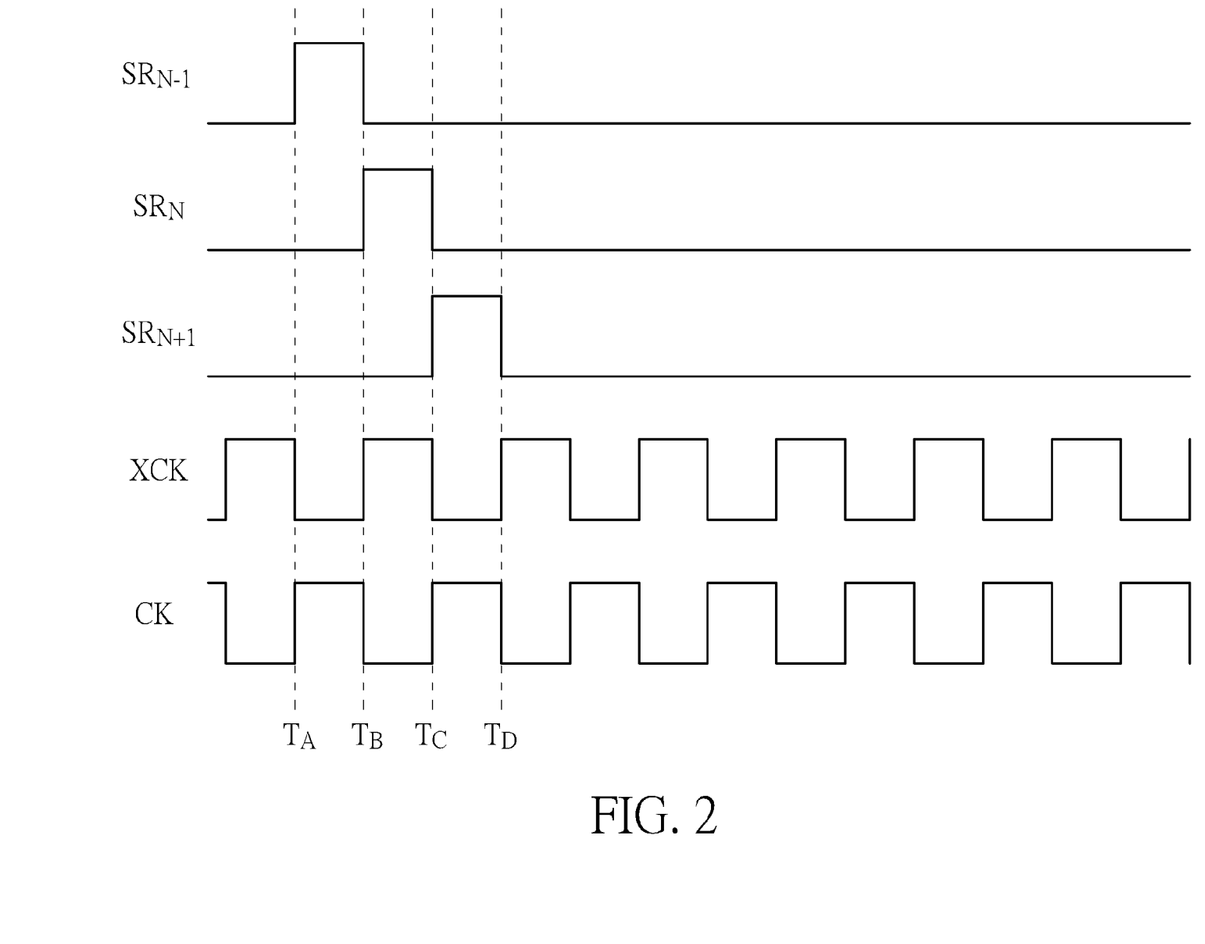
FIG. 2 is a timing diagram of the shift register in FIG. 1.

Please refer to FIG. 1 and FIG. 2. FIG. 1 is a circuit diagram of a shift register 100 according to an embodiment of the present invention. FIG. 2 is a timing diagram of the shift register 100 in FIG. 1. The shift register 100 may be utilized in a gate driver of a display panel, and the gate driver may comprise a plurality of stages of the shift register 100 to provide a plurality of gate signals to controls the operations of turning on/off the pixels of the display panel. The shift register 100 comprises a switch Q1, a pull-up circuit 110, a pull-down circuit 120 and a bidirectional selection circuit 150. The pull-up circuit 110 is configured to turn on/off the switch Q1 according to a voltage level of a first input end IN1 of the shift register 100, such that a voltage level of an output end $S_{R_N}$ of the shift register 100 may be pulled up from a low voltage level to a high voltage level. The pull-down circuit 120 is configured to pull down the voltage level of the output end $S_{R_N}$ of the shift register 100 from the high voltage level to the low voltage level when the switch Q1 is turned off.

The bidirectional selection circuit 150 is configured to selectively couple an output end $SR_{N-1}$ of a previous stage shift register and an output end $SR_{N+1}$ of a next stage shift register to the first input end IN1 and the second input end IN2 of the shift register 100 according to a first selection signal U2D and a second selection signal D2U. When the first selection signal U2D is at a first voltage level (e.g. the high voltage level), and the second selection signal D2U is at a second voltage level (e.g. the low voltage level), the bidirectional selection circuit 150 couples the output end $SR_{N-1}$ to the first input end IN1 and couples the output end $SR_{N+1}$ to the second input end IN2. When the first selection signal U2D is at the second voltage level, and the second selection signal D2U is at the first voltage level, the bidirectional selection circuit 150 couples the output end $SR_{N-1}$ to the second input end IN2 and couples the output end $SR_{N+1}$ to the first input end IN1.

In an embodiment of the present invention, the bidirectional selection circuit 150 may comprise switches Q13 to Q16. The switch Q13 is configured to control the electrical connection between the output end $SR_{N-1}$ of the previous stage shift register and the second input end IN2. The switch Q14 configured to control the electrical connection between the output end $SR_{N-1}$ of the previous stage shift register and the first input end IN1. The switch Q15 is configured to control the electrical connection between the output end $SR_{N+1}$ of the next stage shift register and the first input end IN1. The switch Q16 is configured to control the electrical connection between the output end $SR_{N+1}$ of the next stage shift register and the second input end IN2. The switches Q13 and Q15 are controlled by the second selection signal D2U, and the switches Q14 and Q16 are controlled by the first selection signal U2D. When the switches Q13 and Q15 are turned on, the switches Q14 and Q16 are turned off. When the switches Q14 and Q16 are turned on, the switches Q13 and Q15 are turned off.

It should be noted that the bidirectional selection circuit 150 is not necessary for the shift register 100. In other words, the shift register 100 would operate normally without the bidirectional selection circuit 150. For example, in an embodiment of the present invention, the output end $SR_{N-1}$ is directly coupled to the first input end IN1, and the output end $SR_{N+1}$ is directly coupled to the second input end IN2. In another embodiment of the present invention, the output end $SR_{N-1}$ is directly coupled to the second input end IN2, and the output end $SR_{N+1}$ is directly coupled to the first input end IN1.

FIG. 2 illustrates the waveforms and timing of the voltage levels of the output ends $SR_{N-1}$ and $SR_{N+1}$, a first clock signal XCK and a second clock signal CK when the first input end IN1 is coupled to the output end $SR_{N-1}$, and the second input end IN2 is coupled to the output end $SR_{N+1}$. In the embodiment, it is assumed that the first end of the switch Q1 of the shift register 100 receives the first clock signal XCK, and that the first ends of the switches Q1 of the previous stage shift register and the next stage shift register are receive the second clock signal CK. During the duration $T_A$ to $T_B$, since the voltage level of the first input end IN1 is high and the voltage level of the second input end IN2 is low, the switches Q2, Q8, Q11 and Q12 of the shift register 100 are turned on, and the switch Q7 is turned off. Therefore, the voltage level of the node A is high since the switches Q2 and Q8 are turned on. The voltage level of the node B is low since the node B is coupled to the second system power terminal VSS via the turned-on switch Q12. Moreover, the switch Q1 is turned on since the node A is at the high voltage level. The switches Q6 and Q3 are turned off since the node B is at the low voltage level. The switches Q9 and Q10 are turned on since the control ends thereof are coupled to the first system power terminal VDD. When the switches Q9 and Q10 are turned on, the equivalent resistance of the turned-on switch Q9 is far greater than that of the turned-on switch Q11 since the width-to-length ratio of the switch Q9 is far less than that of the switch Q11. Accordingly, the node C is at the low voltage level, and the switch Q4 is turned off. Moreover, the voltage level of the output end $SR_N$ is low during the duration $T_A$ to $T_B$ since the switch Q1 is turned on, the switches Q3, Q6 and Q7 are turned off, and the first clock signal XCK is at the low voltage level.

During the duration $T_B$ to $T_C$, since the voltage levels of the first input end IN1 and the second input end IN2 is low, the switches Q2, Q7, Q8, Q11 and Q12 are turned off. In addition, due to the coupling effect of the parasitic capacitance of the switch Q1, when the first clock signal XCK is pulled up from the low voltage level to the high voltage level, the voltage level of the node A is pulled up to a greater level. Since the node A is at the greater level, the switch Q1 is turned on, such that the voltage level of the output end $SR_N$ is pulled up to the high voltage level at the time $T_B$, and the switch Q5 is turned on accordingly. Moreover, since the switches Q9 and Q10 are turned on, and the switch Q11 is turned off, the node C is at the high voltage level to turn on the switch Q4. Since the switches Q5 and Q10 are turned on, the voltage level of the node D is determined according to the resistances of the switches Q10 and Q5. Since the width-to-length ratio of the switch Q5 is far greater than that of the switch Q10, the equivalent resistance of the turned-on switch Q5 is far less than that of the turned-on switch Q10. Accordingly, the voltage level of the node D is almost equal to the low voltage level. Additionally, since the switch Q4 is turned on, the voltage level of the node B is almost equal to the voltage level of the node D (i.e. the low voltage level). The switches Q3 and Q6 are turned off since the low voltage level of the node B. Therefore, the voltage level of the output end $SR_N$ is high during the duration $T_B$ to $T_C$.

At the time $T_C$, since the voltage level of the node A is maintained (i.e. at the high voltage level), the switch Q1 is still turned on. Meanwhile, the first clock signal XCK is pulled up from the low voltage level to the high voltage level, such that the voltage level of the output end $SR_N$ is pulled down from the high voltage level to the low voltage level, and the switch Q5 is turned off accordingly. During the duration $T_C$ to $T_B$, since the voltage level of the first input end IN1 is low and the voltage level of the second input end IN2 is high, the switches Q2, Q8, Q11 and Q12 are turned off, and the switch Q7 is turned on. Since the switches Q9 and Q10 are turned on and the switch Q11 is turned off, the voltage level of the node C is high, and the switch Q4 is turned on accordingly. The node B is at the high voltage level since the switches Q10 and Q4 are turned on, and the switches Q3 and Q6 are turned on due to the high voltage level of the node B. Since the switches Q3, Q6 and Q7 are turned on, the voltage level of the node A is pulled down from the high voltage level to the low voltage level, and the switch Q1 is turned off accordingly. Since the switches Q6 and Q7 are turned on and the second system power terminal VSS is at the low voltage level, the voltage level of the output end $SR_N$ is maintained at the low voltage level and the switch Q5 is still turned off. Therefore, during the duration $T_C$ to $T_B$, the state of the switch Q1 is unchanged, and the voltage level of the output end $SR_N$ is pulled down to the low voltage level since the first clock signal XCK is pulled down from the high voltage level to the low voltage level. Then, the voltage level of the node A is pulled down and the switch Q1 is turned off accordingly. Since the switch Q1 is turned off, the voltage level of the output end $SR_N$ is maintained at the low voltage level until the next frame period begins.

Because each of the switches Q1 to Q16 of the shift register 100 may be an NMOSFET, the number of photo-masks for manufacturing the shift register 100 is reduced by 2 as compared to the prior art, and the manufacturing procedure of the shift register is simplified accordingly. In other words, since the shift register of the prior art uses PMOSFET and NMOSFET, the number of photo-masks for manufacturing the prior art shift register is two more than that of the shift register 100 which may only use NMOSFET.

However, the design of the shift register 100 is still not good enough. For example, during the duration $T_A$ to $T_B$, since the switches Q9 and Q11 are turned on, a direct current (DC) path from the first system power terminal VDD through the switches Q9 and Q11 to the second system power terminal VSS is established. Moreover, during the duration $T_B$ to $T_C$, since the switches Q10 and Q5 are turned on, a direct current path from the first system power terminal VDD through the switches Q10 and Q5 to the second system power terminal VSS is established. Due to the foresaid direct current paths, the waste of power of the shift register 100 is not avoided. Moreover, the first clock signal XCK and the second clock signal CK should be non-overlap signals as illustrated in FIG. 2. That is, the rising edges of the first clock signal XCK should be aligned with the falling edges of the second clock signal CK, and the falling edges of the first clock signal XCK should be aligned with the rising edges of the second clock signal CK. If the first clock signal XCK and the second clock signal CK are not the non-overlap signals, the first clock signal XCK and the second clock signal CK would be at the low voltage level at the same time. If the first clock signal XCK and the second clock signal CK are at the low voltage level at the same time, and the output ends $SR_{N-1}$ and $SR_{N+1}$ are at the low voltage level, the node B would be at the high voltage level since the switches Q10 and Q4 are turned on. Accordingly, the switches Q6 and Q3 would be turned on since the node B would be at the high voltage level. However, since the first clock signal XCK is low, the voltage level of the node A has been pulled down to the low voltage level before the voltage level of the output end $SR_N$ is pulled up to the high voltage level. Accordingly, the shift register 100 will operate mistakenly. Moreover, as mentioned above, during the duration $T_B$ to $T_C$, the voltage level of the node A is pulled up to a greater level when the first clock signal XCK is pulled up from the low voltage level to the high voltage level. It is assumed that a first system voltage provided by the first system power terminal VDD is VGH, a second system voltage provided by the second system power terminal VSS is VGL, the threshold voltages of the switches Q2 and Q8 are Vtn, the first system voltage VGH is greater than the second system voltage VGL, and the second system voltage VGL is a negative voltage. In this condition, the highest voltage level and the lowest voltage level of the output end $SR_N$ of the shift register 100 are equal to VGH and VGL respectively, and the voltage level of the node A is pulled up to (2VGH-VGL-2Vtn) during the duration $T_B$ to $T_C$, such that a voltage difference between two ends of the switch Q8 would be too great (i.e. equal to (2VGH-2VGL-2Vtn)). If the switch Q8 is an NMOSFET, it means that the drain-to-source bias of the switch Q8 would be too great.

Figure 3:
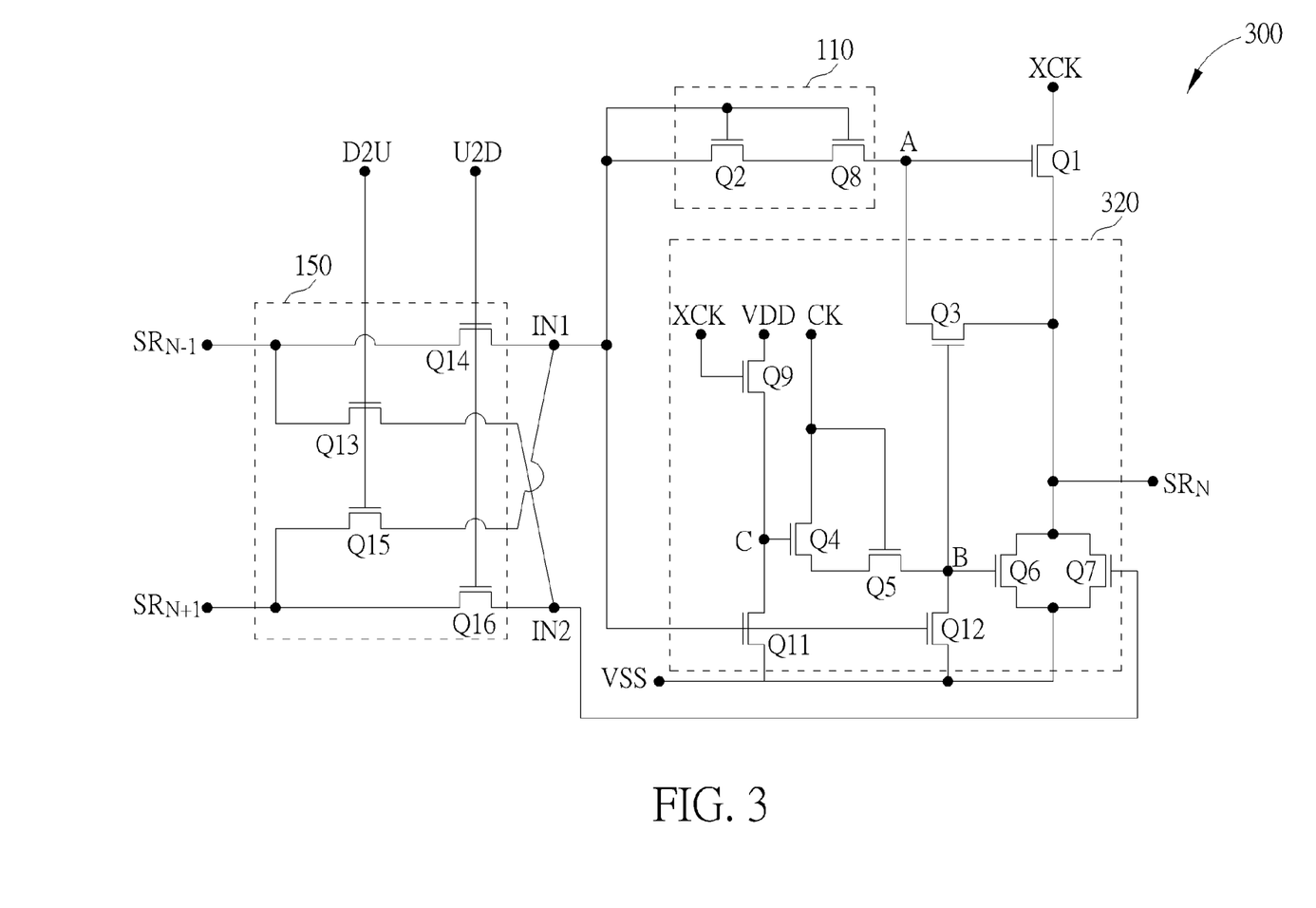
FIG. 3 is a circuit diagram of a shift register according to another embodiment of the present invention.
Figure 4:
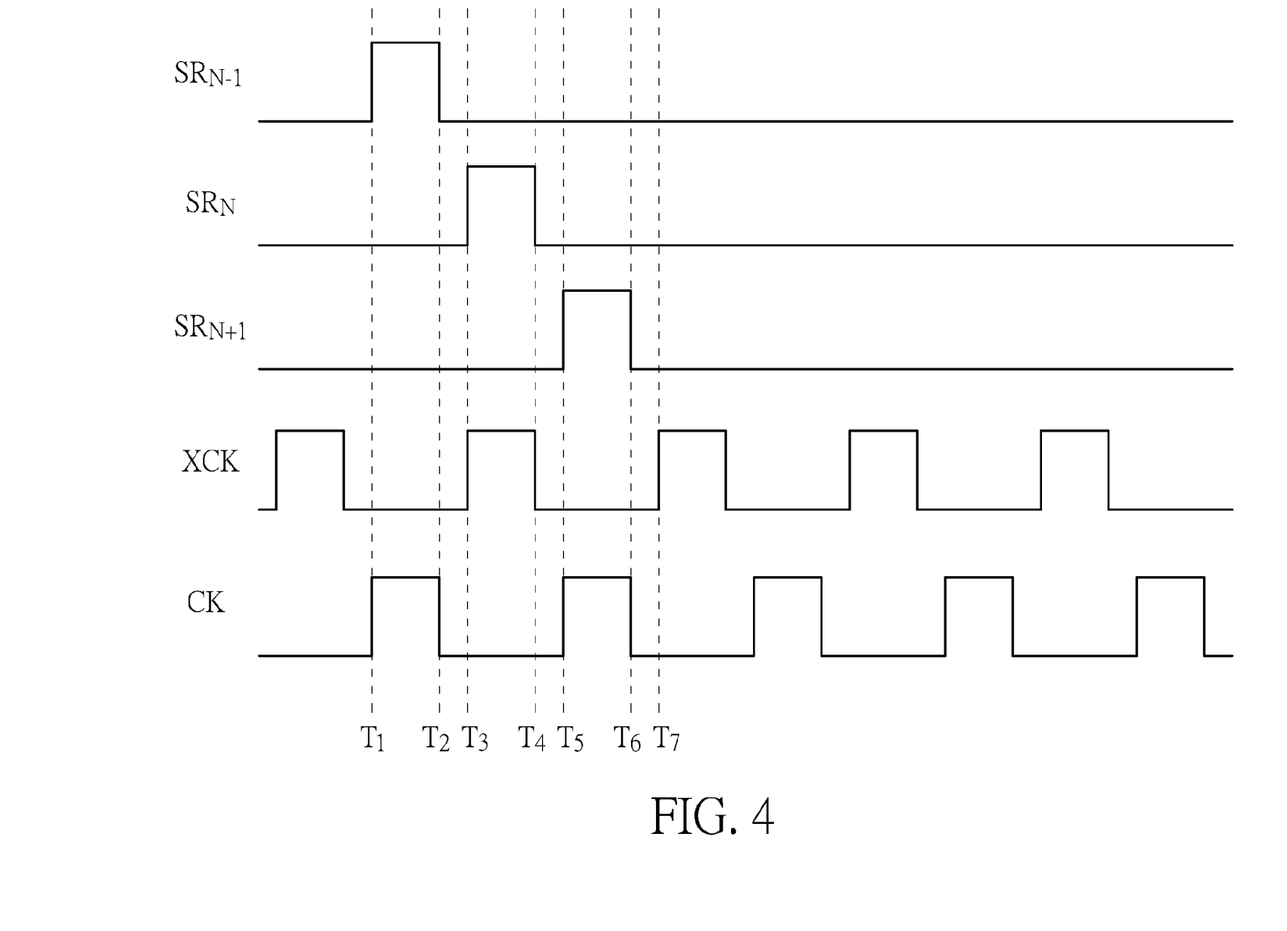
FIG. 4 is a timing diagram of the shift register in FIG. 3.

Please refer to FIG. 3 and FIG. 4. FIG. 3 is a circuit diagram of a shift register 300 according to an embodiment of the present invention. FIG. 4 is a timing diagram of the shift register 300 in FIG. 3. The shift register 300 may be utilized in a gate driver of a display panel, and the gate driver may comprise a plurality of stages of the shift register 300 to provide a plurality of gate signals to controls the operations of turning on/off the pixels of the display panel. The shift register 300 comprises a switch Q1, a pull-up circuit 110, a pull-down circuit 320 and a bidirectional selection circuit 150. The pull-up circuit 110 is configured to turn on/off the switch Q1 according to a voltage level of a first input end IN1 of the shift register 300, such that a voltage level of an output end $S_{RN}$ of the shift register 300 may be pulled up from the low voltage level to the high voltage level. The pull-down circuit 320 is configured to pull down the voltage level of the output end $S_{RN}$ of the shift register 300 from the high voltage level to the low voltage level when the switch Q1 is turned off. In addition, the functions of the bidirectional selection circuit 150 has been explained previously, thus would not be repeated.

In the embodiment, it is assumed that the first input end IN1 is coupled to the output end $SR_{N-1}$ and the second input end IN2 is coupled to the output end $SR_{N+1}$. In the condition, the waveforms and timing of the voltage levels of the output ends $SR_{N-1}$, $SR_N$ and $SR_{N+1}$, the first clock signal XCK and the second clock signal CK would be illustrated as shown in FIG. 4. Please refer to FIGS. 3 and 4. During the duration $T_1$ to $T_2$, since the voltage level of the first input end IN1 is high and the voltage level of the second input end IN2 is low, the switches Q2, Q8, Q11 and Q12 of the shift register 300 are turned on, and the switch Q7 is turned off. Therefore, the voltage level of the node A is high since the switches Q2 and Q8 are turned on. The voltage level of the node B is low since the node B is coupled to the second system power terminal VSS via the turned-on switch Q12. Moreover, the switch Q1 is turned on since the node A is at the high voltage level. The switches Q6 and Q3 are turned off since the node B is at the low voltage level. The switches Q9 is turned off since the first clock signal XCK is at the low voltage level. The switch Q5 is turned on since the second clock signal CK is at the high voltage level. Since the switch Q11 is turned on and the switch Q9 is turned off, the node C is at the low voltage level, and the switch Q4 is turned off accordingly. Moreover, the voltage level of the output end $SR_N$ is low during the duration $T_1$ to $T_2$ since the switch Q1 is turned on, the switches Q3, Q6 and Q7 are turned off, and the first clock signal XCK is at the low voltage level.

During the duration $T_2$ to $T_3$, since the voltage levels of the output end $SR_{N-1}$, the output end $SR_{N+1}$, the first input end IN1 and the second input end IN2 are low, the switches Q2, Q8, Q11, Q12 and Q7 of the shift register 300 are turned off. The switches Q9 is turned off since the first clock signal XCK is at the low voltage level. The switch Q5 is turned off since the second clock signal CK is at the low voltage level. Accordingly, the nodes B and C are floating and maintained at the low voltage level. Since the nodes B and C are maintained at the low voltage level, the switches Q3, Q4 and Q6 are turned off. Since the switches Q3 and Q8 are turned off, the voltage level of the node A is kept at the high voltage level, and the switch Q1 is turned on accordingly. The voltage level of the output end $SR_N$ is still low during the duration $T_2$ to $T_3$ since the first clock signal XCK is at the low voltage level.

During the duration $T_3$ to $T_4$, since the voltage levels of the output end $SR_{N-1}$, the output end $SR_{N+1}$, the first input end IN1 and the second input end IN2 are low, the switches Q2, Q8, Q11, Q12 and Q7 of the shift register 300 are turned off. The switches Q9 is turned on since the first clock signal XCK is at the high voltage level. The switch Q5 is turned off since the second clock signal CK is at the low voltage level. Since the switch Q9 is turned on and the switch Q11 is turned off, the node C is at the high voltage level, and the switch Q4 is turned on accordingly. Since the switches Q5 and Q12 are turned off, the node B is floating and maintained at the low voltage level. Accordingly, the switches Q3 and Q6 are turned off. Due to the turned-off switches Q3 and Q8 and the coupling effect of the parasitic capacitance of the switch Q1, the voltage level of the node A is pulled up to a greater level when the first clock signal XCK is pulled up from the low voltage level to the high voltage level. Since the node A is at the greater level, the switch Q1 is still turned on. Since the switch Q1 is turned on while the switches Q3, Q6 and Q7 are turned off, and the first clock signal XCK is pulled up from the low voltage level to the high voltage level at the time $T_3$, the voltage level of the output end $SR_N$ is pulled up from the low voltage level to the high voltage level at the time $T_3$.

During the duration $T_4$ to $T_5$, since the voltage levels of the output end $SR_{N-1}$, the output end $SR_{N+1}$, the first input end IN1 and the second input end IN2 are low, the switches Q2, Q8, Q11, Q12 and Q7 of the shift register 300 are turned off. The switches Q9 is turned off since the first clock signal XCK is at the low voltage level. The switch Q5 is turned off since the second clock signal CK is at the low voltage level. Accordingly, the nodes B and C are floating, the node B is maintained at the low voltage level, and the node C is maintained at the high voltage level. Since the node B is maintained at the low voltage level, the switches Q3 and Q6 are turned off. The switch Q4 is turned on since the node C is maintained at the high voltage level. In addition, since the switches Q3 and Q8 are turned off, the voltage level of the node A is kept at the high voltage level, and the switch Q1 is turned on accordingly. Since the first clock signal XCK is pulled down from the high voltage level to the low voltage level at the time $T_4$, the voltage level of the output end $SR_N$ is pulled down to the low voltage level at the time $T_4$.

During the duration $T_5$ to $T_6$, since the voltage levels of the output end $SR_{N-1}$ and the first input end IN1 are low and the voltage level of the output end $SR_{N+1}$ and the second input end IN2 are high, the switches Q2, Q8, Q11 and Q12 are turned off, and the switch Q7 is turned on. The switches Q9 is turned off since the first clock signal XCK is at the low voltage level. The switch Q5 is turned on since the second clock signal CK is at the high voltage level. Since the switches Q9 and Q11 are turned off, the node C is floating and maintained at the high voltage level, and the switch Q4 is turned on accordingly. Since the switches Q4 and Q5 are turned on, and the second clock signal CK is at the high voltage level, the node B is at the high voltage level. Since node B is at the high voltage level, the switches Q3 and Q6 are turned on. Since the switches Q3, Q6 and Q7 are turned on, and the first clock signal XCK is at the low voltage level, the node A and the output end $SR_N$ are coupled to the second system power terminal VSS and at the low voltage level during the duration $T_5$ to $T_6$.

During the duration $T_6$ to $T_7$, since the voltage levels of the output end $SR_{N-1}$, the output end $SR_{N+1}$, the first input end IN1 and the second input end IN2 are low, the switches Q2, Q8, Q11, Q12 and Q7 of the shift register 300 are turned off. The switches Q9 is turned off since the first clock signal XCK is at the low voltage level. The switch Q5 is turned off since the second clock signal CK is at the low voltage level. Accordingly, the nodes B and C are floating and maintained at the high voltage level. Since nodes B and C are floating and maintained at the high voltage level, the switches Q3, Q4 and Q6 are turned on. Since the switches Q3 and Q6 are turned on, the voltage levels of the node A and the output end $SR_N$ are maintained at the low voltage level during the duration $T_6$ to $T_7$.

Because each of the switches Q1 to Q9 and Q11 to Q16 of the shift register 300 may be an NMOSFET, the number of photo-masks for manufacturing the shift register 300 is reduced by 2 as compared to the prior art, and the manufacturing procedure of the shift register is simplified accordingly. In other words, since the shift register of the prior art uses PMOSFET and NMOSFET, the number of photomasks for manufacturing the prior art shift register is two more than that of the shift register 300 which may only use NMOSFET.

However, the design of the shift register 300 is still not good enough. For example, during the duration $T_3$ to $T_4$, since the switches Q5 and Q12 are turned off, the node B is floating and maintained at the low voltage level. Since the node B is floating, the switch Q6 is not completely turned off, such that a little current flowing through the switch Q6 causes the waste of power of the shift register 300. Moreover, as mentioned above, during the duration $T_3$ to $T_4$, since the switches Q8 and Q3 are turned on, the voltage level of the node A is pulled up to a greater level when the first clock signal XCK is pulled up from the low voltage level to the high voltage level. It is assumed that a first system voltage provided by the first system power terminal VDD is VGH, a second system voltage provided by the second system power terminal VSS is VGL, the threshold voltages of the switches Q2 and Q8 are Vtn, the first system voltage VGH is greater than the second system voltage VGL, and the second system voltage VGL is a negative voltage. In this condition, the highest voltage level and the lowest voltage level of the output end $SR_N$ of the shift register 300 are equal to VGH and VGL respectively, and the voltage level of the node A is pulled up to (2VGH-VGL-2Vtn) during the duration $T_3$ to $T_4$, such that a voltage difference between two ends of the switch Q8 would be too great (i.e. equal to (2VGH-2VGL-2Vtn)). If the switch Q8 is an NMOSFET, it means that the drain-to-source bias of the switch Q8 would be too great.

Figure 5:
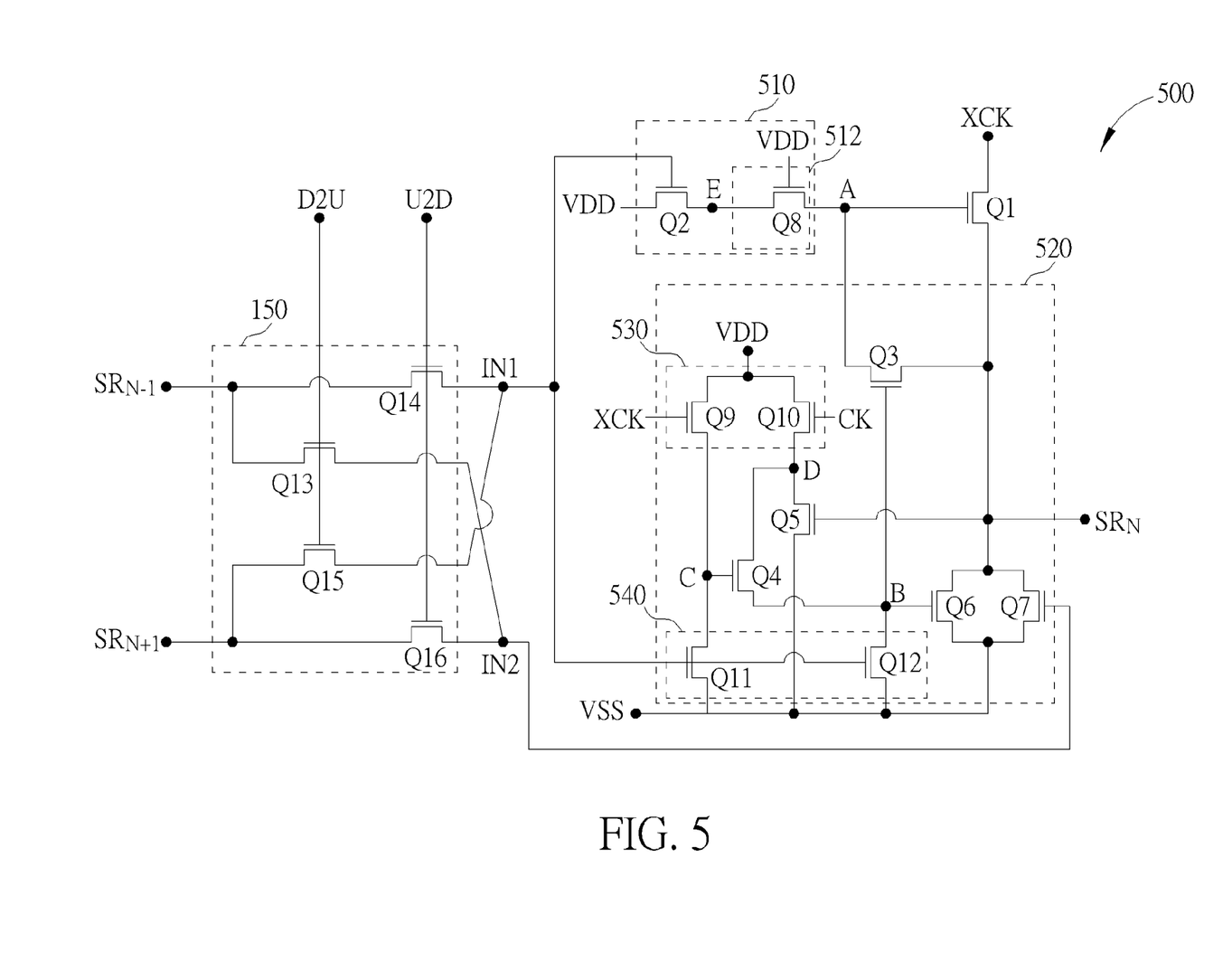
FIG. 5 is a circuit diagram of a shift register according to another embodiment of the present invention.

Please refer to FIG. 5. FIG. 5 is a circuit diagram of a shift register 500 according to an embodiment of the present invention. The shift register 500 comprises a first input end IN1, a second input end IN2, a switch Q1, a pull-up circuit 510, a pull-down circuit 520 and a bidirectional selection circuit 150. The pull-up circuit 510 is configured to turn on/off the switch Q1 according to a voltage level of the first input end IN1, such that a voltage level of an output end $S_{RN}$ of the shift register 500 may be pulled up from the low voltage level to the high voltage level. The pull-down circuit 520 is configured to pull down the voltage level of the output end $S_{RN}$ of the shift register 500 from the high voltage level to the low voltage level when the switch Q1 is turned off. In addition, the functions of the bidirectional selection circuit 150 has been explained previously, thus would not be repeated.

A first end of first switch Q1 receives the first clock signal XCK, a second end of first switch Q1 is coupled to an output end $SR_N$ of the shift register 500, and a control end of first switch Q1 is coupled to the node A. The pull-up circuit 510 comprises a switch Q2 and a first control circuit 512. A first end of the switch Q2 is coupled to the first system power terminal VDD, and a control end of the switch Q2 is coupled to the first input end IN1. The control circuit 512 is configured to control electrical connection between the second end of the switch Q2 and the node A according to the voltage level of the first system power terminal VDD. The pull-down circuit 520 comprises switches Q3 to Q7, a second control circuit 530 and a third control circuit 540. A first end of the switch Q3 is coupled to the node A, a second end of the switch Q3 is coupled to the output end $SR_N$, and a control end of the switch Q3 is coupled to the node B. A first end of the switch Q4 is coupled to the node D, a second end of the switch Q4 is coupled to the node B, and a control end of the switch Q4 is coupled to the node C. A first end of the switch Q5 is coupled to the node D, a second end of the switch Q5 is coupled to the second system power terminal VSS, and a control end of the switch Q5 is coupled to the output end $SR_N$. A first end of the switch Q6 is coupled to the output end $SR_N$, a second end of the switch Q6 is coupled to the second system power terminal VSS, and a control end of the switch Q6 is coupled to the node B. A first end of the switch Q7 is coupled to the output end $SR_N$, a second end of the switch Q7 is coupled to the second system power terminal VSS, and a control end of the switch Q7 is coupled to the second input end IN2.

The second control circuit 530 is configured to control electrical connection between the first system power terminal VDD and the node C according to the first clock signal XCK, and is configured to control the electrical connection between the first system power terminal VDD and the node D according to the second clock signal CK. When the first clock signal XCK is at a first voltage level (e.g. the high voltage level), the second clock signal CK is at a second voltage level (e.g. the low voltage level), and the second control circuit 530 establishes the electrical connection between the first system power terminal VDD and the node C and electrically disconnects the first system power terminal VDD from the node D. When the second clock signal CK is at the first voltage level (e.g. the high voltage level), the first clock signal XCK is at the second voltage level (e.g. the low voltage level), and the second control circuit 530 establishes the electrical connection between the first system power terminal VDD and the node D and electrically disconnects the first system power terminal VDD from the node C. In an embodiment of the present invention, the second control circuit 530 may comprise switches Q9 and Q10. A first end of the switch Q9 is coupled to the first system power terminal VDD, a second end of the switch Q9 is coupled to the node C, and a control end of the switch Q9 receives the first clock signal XCK. A first end of the switch Q10 is coupled to the first system power terminal VDD, a second end of the switch Q10 is coupled to the node D, and a control end of the switch Q10 receives the second clock signal CK. The switch Q9 operates according to the first clock signal XCK, and the switch Q10 operates according to the second clock signal CK.

The third control circuit 540 is configured to control the electrical connection between the second system power terminal VSS and the node B and the electrical connection between the second system power terminal VSS and the node C according to the voltage level of the first input end IN1. When the voltage level of the first input end IN1 is the first voltage level (e.g. the high voltage level), the third control circuit 540 establishes the electrical connection between the second system power terminal VSS and the node B and the electrical connection between the second system power terminal VSS and the node C. When the voltage level of the first input end IN1 is the second voltage level (e.g. the low voltage level), the third control circuit 540 electrically disconnects the second system power terminal VSS from the nodes B and C. In an embodiment of the present invention, the third control circuit 540 may comprise switches Q11 and Q12. A first end of the switch Q11 is coupled to the node C, a second end of the switch Q11 is coupled to the second system power terminal VSS, and a control end of the switch Q11 is coupled to the first input end IN1. A first end of the switch Q12 is coupled to the node B, a second end of the switch Q12 is coupled to the second system power terminal VSS, and a control end of the switch Q12 is coupled to the first input end IN1.

Figure 6:
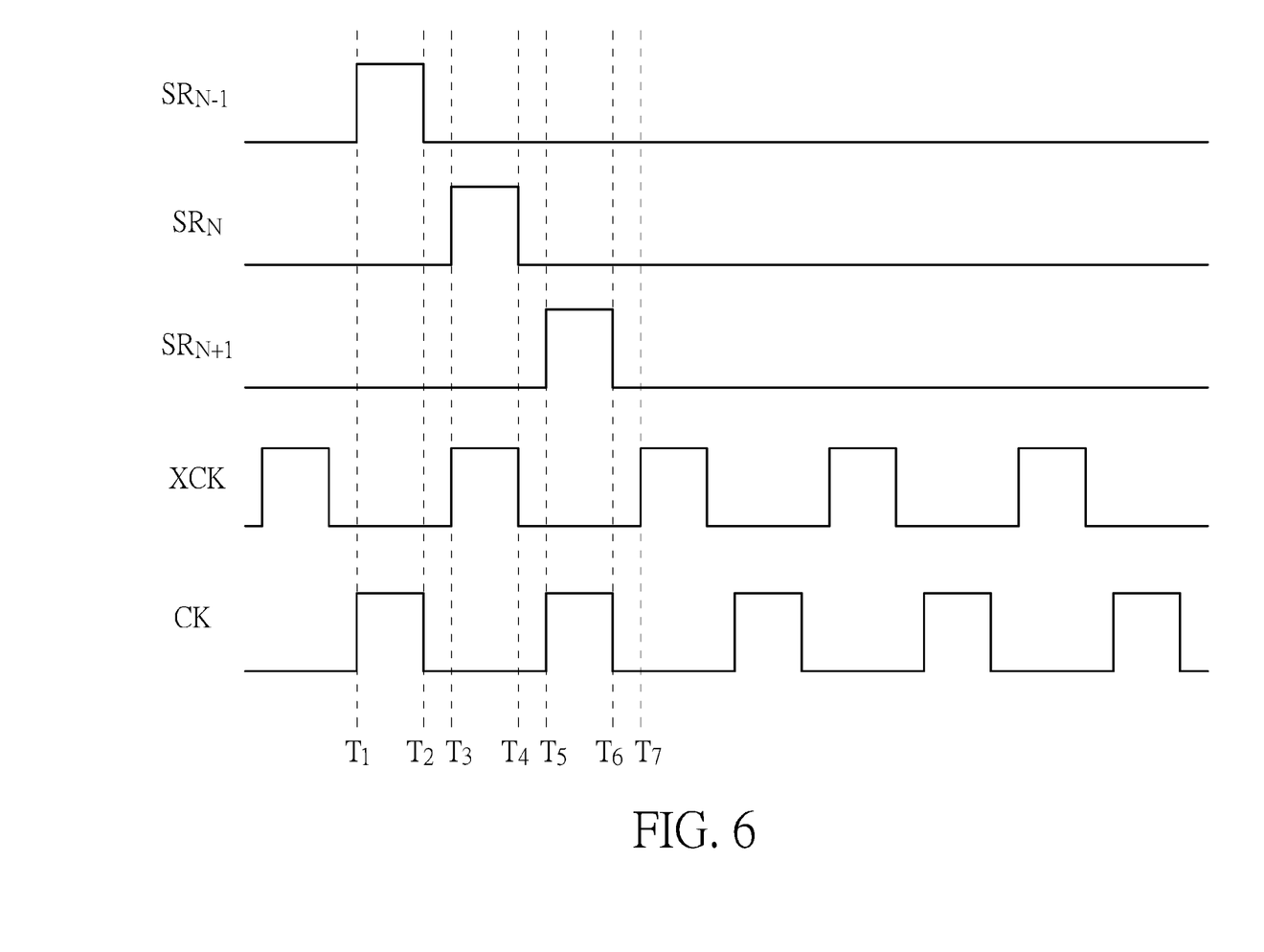
FIG. 6 is a timing diagram of the shift register in FIG. 5.

In the embodiment, it is assumed that the first input end IN1 of the shift register 500 is coupled to the output end $SR_{N-1}$ of the previous stage shift register, and that the second input end IN2 of the shift register 500 is coupled to the output end $SR_{N+1}$ of the next stage shift register. In the condition, the waveforms and timing of the voltage levels of the output ends $SR_{N-1}$, $SR_N$ and $SR_{N+1}$, the first clock signal XCK and the second clock signal CK would be illustrated as shown in FIG. 6. Please refer to FIGS. 5 and 6. During the duration $T_1$ to $T_2$, since the voltage level of the first input end IN1 is high, and the voltage levels of the output end $SR_{N+1}$ and the second input end IN2 are low, the switches Q2, Q11 and Q12 of the shift register 500 are turned on, and the switch Q7 is turned off. Moreover, the switch Q8 is turned on continually since the first system power terminal VDD is at the high voltage level. Therefore, the voltage level of the node A is high since the switches Q2 and Q8 are turned on. The voltage level of the node B is low since the node B is coupled to the second system power terminal VSS via the turned-on switch Q12. The switches Q6 and Q3 are turned off since the node A is at the high voltage level. The switches Q6 and Q3 are turned off since the node B is at the low voltage level. Moreover, the switches Q9 is turned off since the first clock signal XCK is at the low voltage level. The switch Q10 is turned on since the second clock signal CK is at the high voltage level. Since the switch Q11 is turned on and the switch Q9 is turned off, the node C is at the low voltage level, and the switch Q4 is turned off accordingly. Moreover, the voltage level of the output end $SR_N$ is low during the duration $T_1$ to $T_2$ since the switch Q1 is turned on, the switches Q3, Q6 and Q7 are turned off, and the first clock signal XCK is at the low voltage level. The switch Q5 is turned off since the voltage level of the output end $SR_N$ is low.

During the duration $T_2$ to $T_3$, since the voltage levels of the output end $SR_{N-1}$, the output end $SR_{N+1}$, the first input end IN1 and the second input end IN2 are low, the switches Q2, Q11, Q12 and Q7 of the shift register 500 are turned off. The switches Q9 is turned off since the first clock signal XCK is at the low voltage level. Accordingly, the node C is floating and maintained at the low voltage level, and the switch Q4 is turned off accordingly. Moreover, since the switches Q4 and Q12 are turned off, the node B is also floating and maintained at the low voltage level. Since the nodes B and C are at the low voltage level, the switches Q3 and Q6 are turned off. In addition, since the switches Q2 and Q3 are turned off, the node A is at the high voltage level. Accordingly, the switch Q1 is turned on. The voltage level of the output end $SR_N$ is still low during the duration $T_2$ to $T_3$ since the first clock signal XCK is at the low voltage level. Moreover, the switch Q10 is turned off since the second clock signal CK is at the low voltage level, and the switch Q5 is turned off since the voltage level of the output end $SR_N$ is still low.

During the duration $T_3$ to $T_4$, since the voltage levels of the output end $SR_{N-1}$, the output end $SR_{N+1}$, the first input end IN1 and the second input end IN2 are low, the switches Q2, Q11, Q12 and Q7 of the shift register 500 are turned off. The switches Q9 is turned on since the first clock signal XCK is at the high voltage level. The switch Q10 is turned off since the second clock signal CK is at the low voltage level. Moreover, since the switch Q9 is turned on and the switch Q11 is turned off, the node C is at the high voltage level, and the switch Q4 is turned on accordingly. The switch Q5 is turned on because the voltage level of the output end $SR_N$ is still high. Since the switches Q4 and Q5 are turned on, the second system power terminal VSS is coupled to the node D via the turned-on switch Q5 and coupled to the node B via the turned-on switches Q5 and Q4, such that the nodes B and D are at the low voltage level. Accordingly, the switches Q3 and Q6 are turned off. Since the switch Q1 is turned on while the switches Q3, Q6 and Q7 are turned off, and the first clock signal XCK is pulled up to the high voltage level at the time $T_3$, the voltage level of the output end $SR_N$ is pulled up to the high voltage level at the time $T_3$.

Moreover, since the control end of the switch Q8 is coupled to the first system power terminal VDD, the voltage level of the node E is equal to the voltage level of the first system power terminal VDD when the first clock signal XCK is pulled up from the low voltage level to the high voltage level at the time $T_3$. It is assumed that a first system voltage provided by the first system power terminal VDD is VGH, a second system voltage provided by the second system power terminal VSS is VGL, the threshold voltages of the switches Q2 and Q8 are Vtn, the first system voltage VGH is greater than the second system voltage VGL, and the second system voltage VGL is a negative voltage. In this condition, the highest voltage level and the lowest voltage level of the output end $SR_N$ of the shift register 100 are equal to VGH and VGL respectively. Even thought the voltage level of the node A is pulled up to (2VGH-VGL-2Vtn) during the duration $T_3$ to $T_4$, since the voltage level of the node E is equal to VGH, a voltage difference between two ends of the switch Q8 of the shift register 500 is equal to (2VGH-2VGL-2Vtn), which is less than those of the shift registers 100 and 300 (i.e. (2VGH-VGL-2Vtn)). Therefore, the operations of the switch Q8 of the shift register 500 are safer and more stable. Moreover, since the node B is coupled to the second system power terminal VSS via the turned-on switches Q5 and Q4 during the duration $T_3$ to $T_4$, the node B is not floating, such that the switch Q6 is turned off more effectively. Accordingly, the power consumption of the shift register 500 is less than that of the shift register 300.

Please refer to FIGS. 5 and 6 again. During the duration $T_4$ to $T_5$, since the voltage levels of the output end $SR_{N-1}$, the output end $SR_{N+1}$, the first input end IN1 and the second input end IN2 are low, the switches Q2, Q11, Q12 and Q7 of the shift register 500 are turned off. The switches Q9 is turned off since the first clock signal XCK is at the low voltage level. The switches Q10 is turned off since the second clock signal CK is at the low voltage level. Meanwhile, the nodes B and D are floating and maintained at the low voltage level, and the node C is floating and maintained at the high voltage level. Accordingly, the switches Q3 and Q6 are turned off. The switch Q4 is turned on because the node C is at the high voltage level. In addition, since the switches Q3 and Q2 are turned off, the node A is maintained at the high voltage level, and the switch Q1 is turned on accordingly. Since the first clock signal XCK is pulled down from the high voltage level to the low voltage level at the time $T_4$, the voltage level of the output end $SR_N$ is pulled down to the low voltage level at the time $T_4$.

During the duration $T_5$ to $T_6$, since the voltage levels of the output end $SR_{N-1}$ and the first input end IN1 are low, and the voltage levels of the output end $SR_{N+1}$ and the second input end IN2 are high, the switches Q2, Q11 and Q12 of the shift register 500 are turned off, and the switch Q7 is turned on. The switches Q9 is turned off since the first clock signal XCK is at the low voltage level. The switches Q10 is turned on since the second clock signal CK is at the high voltage level. Meanwhile, since the switches Q9 and Q11 are turned off, the node C is floating and maintained at the high voltage level. The switch Q4 is turned on because the node C is at the high voltage level. Since the switches Q4 and Q10 are turned on, the node B is coupled to the first system power terminal VDD and at the high voltage level. Accordingly, the switches Q3 and Q6 are turned on. Since the switches Q3, Q6 and Q7 are turned on, and the first clock signal XCK is at the low voltage level, the voltage levels of the node A and the output end $SR_N$ are at the low voltage level during the duration $T_5$ to $T_6$.

During the duration $T_6$ to $T_7$, since the voltage levels of the output end $SR_{N-1}$, the output end $SR_{N+1}$, the first input end IN1 and the second input end IN2 are low, the switches Q2, Q11, Q12 and Q7 of the shift register 500 are turned off. The switches Q9 is turned off since the first clock signal XCK is at the low voltage level. The switches Q10 is turned off since the second clock signal CK is at the low voltage level. Meanwhile, the nodes B, C and D are floating and maintained at the high voltage level. Accordingly, the switches Q3, Q4 and Q6 are turned on. Since the switches Q3 and Q6 are turned on, the voltage levels of the node A and the output end $SR_N$ are at the low voltage level during the duration $T_6$ to $T_7$.

Figure 7:
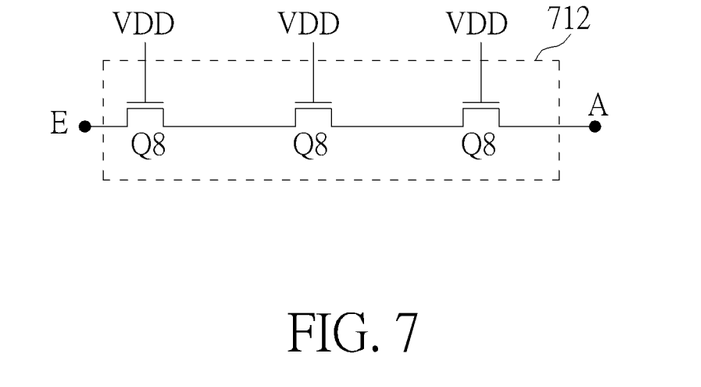
FIG. 7 is a circuit diagram of a shift register according to another embodiment of the present invention.

In the above embodiments, the first control circuit 512 has a switch Q8, but the present invention is not limited thereto. For example, the first control circuit 512 of the shift register 500 in FIG. 5 may be replaced by the first control circuit 712 in FIG. 7. The first control circuit 712 has a plurality of switches Q8. The control end of each of the switches Q8 is coupled to the first system power terminal VDD. The first end of the first one of the switches Q8 is coupled to the second end (i.e. the node E) of the switch Q2, the second end of the last one of the switches Q8 is coupled to the node A. With the help of the switches Q8, the operations of the shift register 500 are safer and more stable.

Additionally, as shown in FIG. 6, the portions of the first clock signal XCK at the high voltage level do not overlap in the timeline with the portions of the second clock signal CLK at the high voltage level. Moreover, in the embodiment of FIG. 6, the first clock signal XCK and the second clock signal CK may be both at the low voltage level at the same time. However, the waveforms of the first clock signal XCK and the second clock signal CK which are acceptable for the shift register 500 are not limited thereto. For example, in another embodiment of the present invention, the rising edges of the first clock signal XCK may be aligned with the falling edges of the second clock signal CK, and the falling edges of the first clock signal XCK may be aligned with the rising edges of the second clock signal CK.

Because each of the switches Q1 to Q16 of the shift register 500 may be an NMOSFET, the number of photo-masks for manufacturing the shift register 500 is reduced by 2 as compared to the prior art, and the manufacturing procedure of the shift register is simplified accordingly. In other words, since the shift register of the prior art uses PMOSFET and NMOSFET, the number of photo-masks for manufacturing the prior art shift register is two more than that of the shift register 500 which may only use NMOSFET. Moreover, during the duration $T_3$ to $T_4$, the voltage difference between two ends of the switch Q8 of the shift register 500 is equal to (2VGH-2VGL-2Vtn), such that the operations of the switch Q8 of the shift register 500 are safer and more stable. Moreover, since the node B is not floating during the duration $T_3$ to $T_4$, the switch Q6 is turned off more effectively. Accordingly, the power consumption of the shift register 500 is less than that of the shift register 300.

In summary, according to the embodiments of the present invention, the waste of power of the shift register may be avoided, such that energy consumption is reduced. Moreover, the switches in each embodiments of the present invention may be transistors of the same type (e.g. NMOS-FET). Accordingly, the number of photo-masks for manufacturing the shift register is reduced, and the manufacturing procedure of the shift register is simplified. Since the shift register has fewer transistors due to a compact design, the cost of the shift register could be increased, and it is suitable to achieve the narrow bezel design of the display panel.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A shift register, comprising:
a first input end;
a second input end;
a first switch, having a first end, a second end and a control end, the first end receiving a first clock signal, the second end being coupled to an output end of the shift register, and the control end being coupled to a first node;
a pull-up circuit, comprising:
a second switch, having a first end, a second end and a control end, the first end of the second switch being coupled to a first system power terminal, and the control end of the second switch being coupled to the first input end; and
a first control circuit, configured to control electrical connection between the second end of the second switch and the first node according to a voltage level of the first system power terminal; and
a pull-down circuit, comprising:
a third switch, a first end of the third switch being coupled to the first node, a second end of the third switch being coupled to the output end of the shift register, and a control end of the third switch being coupled to a second node;
a second control circuit, configured to control electrical connection between the first system power terminal and a third node according to the first clock signal and configured to control electrical connection between the first system power terminal and a fourth node according to a second clock signal;
a third control circuit, configured to control electrical connection between a second system power terminal and the second node and electrical connection between the second system power terminal and the third node according to a voltage level of the first input end;
a fourth switch, a first end of the fourth switch being coupled to the fourth node, a second end of the fourth switch being coupled to the second node, and a control end of the fourth switch being coupled to the third node;
a fifth switch, a first end of the fifth switch being coupled to the fourth node, a second end of the fifth switch being coupled to the second system power terminal, and a control end of the fifth switch being coupled to the output end of the shift register;
a sixth switch, a first end of the sixth switch being coupled to the output end of the shift register, a second end of the sixth switch being coupled to the second system power terminal, and a control end of the sixth switch being coupled to the second node; and
a seventh switch, a first end of the seventh switch being coupled to the output end of the shift register, a second end of the seventh switch being coupled to the second system power terminal, and a control end of the seventh switch being coupled to the second input end.

2. The shift register of claim 1, wherein the first control circuit comprises a eighth switch, a first end of the eighth switch is coupled to the second end of the second switch, a second end of the eighth switch is coupled to the first node, and a control end of the eighth switch is coupled to the first system power terminal.

3. The shift register of claim 1, wherein the first control circuit comprises a plurality of eighth switches connected in series, a control end of each of the eighth switches is coupled to the first system power terminal, a first end of a first one of the eighth switches is coupled to the second end of the second switch, a second end of a last one of the eighth switches is coupled to the first node.

4. The shift register of claim 1, wherein the second control circuit comprises:
a ninth switch, a first end of the ninth switch being coupled to the first system power terminal, a second end of the ninth switch being coupled to the third node, and a control end of the ninth switch receiving the first clock signal; and
a tenth switch, a first end of the tenth switch being coupled to the first system power terminal, a second end of the tenth switch being coupled to the fourth node, and a control end of the tenth switch receiving the second clock signal.

5. The shift register of claim 1, wherein the third control circuit comprises:
an eleventh switch, a first end of the eleventh switch being coupled to the third node, a second end of the eleventh switch being coupled to the second system power terminal, and a control end of the eleventh switch being coupled to the first input end; and
a twelfth switch, a first end of the twelfth switch being coupled to the second node, a second end of the twelfth switch being coupled to the second system power terminal, and a control end of the twelfth switch being coupled to the first input end.

6. The shift register of claim 1, wherein the first clock signal is at a high voltage level when the second clock signal is at a low voltage level, and the second clock signal is at the high voltage level when the first clock signal is at the low voltage level.

7. The shift register of claim 6, wherein portions of the first clock signal at the high voltage level do not overlap in a timeline with portions of the second clock signal at the high voltage level.

8. The shift register of claim 1 further comprising:
a bidirectional selection circuit, configured to selectively couple an output end of a previous stage shift register and an output end of a next stage shift register to the first input end and the second input end of the shift register.

9. The shift register of claim 8, wherein the bidirectional selection circuit comprises:
a thirteenth switch, configured to control electrical connection between the output end of the previous stage shift register and the second input end;

a fourteenth switch, configured to control electrical connection between the output end of the previous stage shift register and the first input end;

a fifteenth switch, configured to control electrical connection between the output end of the next stage shift register and the first input end; and a sixteenth switch, configured to control electrical connection between the output end of the next stage shift register and the second input end;

wherein when the thirteenth switch and the fifteenth switch are turned on, the fourteenth switch and the sixteenth switch are turned off; and wherein when the fourteenth switch and the sixteenth switch are turned on, the thirteenth switch and the fifteenth switch are turned off.

10. The shift register of claim 1, wherein each of the switches is an N-channel metal-oxide-semiconductor field-effect transistor, and the control end of each of the switches is a gate of the N-channel metal-oxide-semiconductor field-effect transistor.

11. A method for controlling operations of the shift register of claim 1, the method comprising:

controlling the second clock signal to be at a low voltage level when the first clock signal is at a high voltage level; and controlling the first clock signal to be at the low voltage level when the second clock signal is at the high voltage level.

12. The method of claim 11 further comprising:

preventing portions of the first clock signal at the high voltage level from overlapping in a timeline with portions of the second clock signal at the high voltage level.

13. The method of claim 11 further comprising:

aligning rising edges of the first clock signal with falling edges of the second clock signal; and aligning falling edges of the first clock signal with rising edges of the second clock signal.

14. The method of claim 11 further comprising:

applying a first system voltage to the first system power terminal; and applying a second system voltage to the second system power terminal;

wherein the first system voltage is greater than the second system voltage.

* * * * *